United States Patent
Komiyama et al.

(10) Patent No.: US 8,212,288 B2
(45) Date of Patent: Jul. 3, 2012

(54) COMPOUND SEMICONDUCTOR SUBSTRATE COMPRISING A MULTILAYER BUFFER LAYER

(75) Inventors: Jun Komiyama, Hadano (JP); Kenichi Eriguchi, Hadano (JP); Hiroshi Oishi, Hadano (JP); Yoshihisa Abe, Hadano (JP); Akira Yoshida, Hadano (JP); Shunichi Suzuki, Hadano (JP)

(73) Assignee: Covalent Materials Corporation, Shinagawa-Ku, Tokyo (JP)

( * ) Notice: Subject to any disclaimer, the term of this patent is extended or adjusted under 35 U.S.C. 154(b) by 83 days.

(21) Appl. No.: 12/879,035

(22) Filed: Sep. 10, 2010

(65) Prior Publication Data
US 2011/0062556 A1 Mar. 17, 2011

(30) Foreign Application Priority Data

Sep. 14, 2009 (JP) ................................. 2009-211189
Jul. 6, 2010 (JP) ................................. 2010-153634

(51) Int. Cl.
*H01L 21/02* (2006.01)

(52) U.S. Cl. ........ 257/190; 257/183; 257/191; 257/192; 257/200; 257/E21.09; 257/E21.097; 257/E21.098; 257/E21.108; 257/E21.109; 257/E21.11; 257/E21.112; 257/E21.116; 257/E21.371; 257/E21.387; 257/E29.188

(58) Field of Classification Search .................. 257/183, 257/190, 191, 192, 200, E21.09, E21.097, 257/E21.098, E21.108, E21.109, E21.11, 257/E21.112, E21.116, E21.371, E21.387, 257/E29.188

See application file for complete search history.

(56) References Cited

U.S. PATENT DOCUMENTS
7,749,828 B2 * 7/2010 Hashimoto et al. ........... 438/172

FOREIGN PATENT DOCUMENTS
JP 2007-67077 A 3/2007
JP 2008-171843 A 7/2008

* cited by examiner

*Primary Examiner* — Jay C Kim
(74) *Attorney, Agent, or Firm* — Buchanan Ingersoll & Rooney PC

(57) ABSTRACT

A compound semiconductor substrate which inhibits the generation of a crack or a warp and is preferable for a normally-off type high breakdown voltage device, arranged that a multilayer buffer layer 2 in which $Al_xGa_{1-x}N$ single crystal layers ($0.6 \leq X \leq 1.0$) 21 containing carbon from $1\times10^{18}$ atoms/cm$^3$ to $1\times10^{21}$ atoms/cm$^3$ and $Al_yGa_{1-y}N$ single crystal layers ($0.1 \leq y \leq 0.5$) 22 containing carbon from $1\times10^{17}$ atoms/cm$^3$ to $1\times10^{21}$ atoms/cm$^3$ are alternately and repeatedly stacked in order, and a nitride active layer 3 provided with an electron transport layer 31 having a carbon concentration of $5\times10^{17}$ atoms/cm$^3$ or less and an electron supply layer 32 are deposited on a Si single crystal substrate 1 in order. The carbon concentrations of the $Al_xGa_{1-x}N$ single crystal layers 21 and that of the $AlGa_{1-y}N$ single crystal layers 22 respectively decrease from the substrate 1 side towards the above-mentioned active layer 3 side. In this way, the compound semiconductor substrate is produced.

32 Claims, 7 Drawing Sheets

FIG. 2

[Table 1]

| Sample No. | $Al_xGa_{1-x}N$ x | $Al_yGa_{1-y}N$ y | $Al_zGa_{1-z}N$ z | Dislocation density $(cm^{-2})$ | Warp (μm) | Crack | Pinch off voltage (V) | Breakdown voltage (V) | Leak current | Electron mobility $(cm^2/Vs)$ |
|---|---|---|---|---|---|---|---|---|---|---|
| 1 | 1 | 0 | 0.02 | $1\times10^9$ | 45 | Non | 0.6 | 900 | 1 | 1000 |
| 2 | 0.5 | 0.2 | 0 | $2\times10^9$ | 60 | Observed | 0.8 | 800 | 1.2 | 1200 |
| 3 | 0.6 | 0.2 | 0 | $1\times10^9$ | 45 | Non | 0.8 | 850 | 1 | 1200 |
| 4 | 1 | 0.2 | 0 | $1\times10^9$ | 30 | Non | 0.85 | 900 | 1 | 1200 |
| 5 | 1 | 0 | 0 | $1\times10^9$ | 45 | Non | 0.85 | 850 | 1 | 1200 |
| 6 | 1 | 0.1 | 0 | $1\times10^9$ | 30 | Non | 0.85 | 850 | 1 | 1200 |
| 7 | 1 | 0.5 | 0 | $1\times10^9$ | 45 | Non | 0.85 | 850 | 1 | 1200 |
| 8 | 1 | 0.6 | 0 | $2\times10^9$ | 60 | Observed | 0.85 | 800 | 1.2 | 1200 |

FIG. 3

[Table 2]

| Sample No. | Al$_x$Ga$_{1-x}$N Carbon concentration (atoms/cm$^3$) | Al$_y$Ga$_{1-y}$N Carbon concentration (atoms/cm$^3$) | Dislocation density (cm$^{-2}$) | Warp (μm) | Crack | Pinch off voltage (V) | Breakdown voltage (V) | Leak current | Electron mobility (cm$^2$/Vs) |
|---|---|---|---|---|---|---|---|---|---|
| 9 | 1×10$^{17}$ | 1×10$^{20}$ | 1×10$^9$ | 45 | Non | 0.85 | 650 | 1 | 1200 |
| 10 | 5×10$^{19}$ | 1×10$^{20}$ | 1×10$^9$ | 30 | Non | 1 | 900 | 1 | 1200 |
| 11 | 5×10$^{21}$ | 1×10$^{20}$ | 1×10$^{10}$ | 45 | Observed | 0.9 | 850 | 1.2 | 1200 |
| 12 | 1×10$^{20}$ | 5×10$^{16}$ | 1×10$^9$ | 45 | Non | 0.8 | 650 | 1 | 1200 |
| 13 | 1×10$^{20}$ | 5×10$^{19}$ | 1×10$^9$ | 30 | Non | 1 | 900 | 1 | 1200 |
| 14 | 1×10$^{20}$ | 2×10$^{20}$ | 1×10$^9$ | 45 | Non | 0.8 | 850 | 1 | 1200 |
| 15 | 1×10$^{20}$ | 5×10$^{21}$ | 1×10$^{10}$ | 45 | Non | 0.9 | 850 | 1.2 | 1200 |
| 16 | 1×10$^{20}$ / 3×10$^{20}$ | 5×10$^{19}$ / 5×10$^{20}$ | 2×10$^9$ | 90 | Observed | 0.7 | 800 | 1 | 1200 |

FIG. 4

[Table 3]

| Sample No. | $Al_xGa_{1-x}N$ Boron concentration (atoms/cm³) | $Al_yGa_{1-y}N$ y | $Al_yGa_{1-y}N$ Boron concentration (atoms/cm³) | Dislocation density (cm⁻²) | Warp (μm) | Crack | Pinch off voltage (V) | Breakdown voltage (V) | Leak current | Electron mobility (cm²/Vs) |
|---|---|---|---|---|---|---|---|---|---|---|
| 17 | 5×10¹⁶ | 0.2 | 5×10¹⁶ | 1×10⁹ | 45 | Non | 1 | 820 | 1 | 1200 |
| 18 | 5×10¹⁸ | 0.2 | 1×10¹⁸ | 1×10⁹ | 30 | Non | 1 | 900 | 1 | 1200 |
| 19 | 1×10¹⁹ | 0.2 | 1×10¹⁹ | 2×10⁹ | 45 | Non | 1 | 820 | 1.05 | 1200 |
| 20 | 5×10¹⁹ | 0.2 | 5×10¹⁹ | 5×10⁹ | 45 | Non | 0.9 | 850 | 1.05 | 1200 |

FIG. 5

[Table 4]

| Sample No. | $Al_xGa_{1-x}N$ Carbon concentration (atoms/cm³) | $Al_xGa_{1-x}N$ Boron concentration (atoms/cm³) | y | $Al_yGa_{1-y}N$ Carbon concentration (atoms/cm³) | $Al_yGa_{1-y}N$ Boron concentration (atoms/cm³) | z | $Al_zGa_{1-z}N$ Carbon concentration (atoms/cm³) | $Al_zGa_{1-z}N$ Thickness (μm) | Dislocation density (cm⁻²) | Warp (μm) | Crack | Pinch off voltage (V) | Breakdown voltage (V) | Leak current | Electron mobility (cm²/Vs) |
|---|---|---|---|---|---|---|---|---|---|---|---|---|---|---|---|
| 21 | $1\times10^{20}$ | $5\times10^{18}$ | 0.05 | $1\times10^{20}$ | $1\times10^{18}$ | 0 | $5\times10^{17}$ | 500 | $1\times10^{9}$ | 45 | Non | 0.8 | 750 | 1 | 1200 |
| 22 | $1\times10^{20}$ | $5\times10^{18}$ | 0.2 | $1\times10^{20}$ | $1\times10^{18}$ | 0.1 | $5\times10^{17}$ | 500 | $1\times10^{9}$ | 30 | Non | 0.8 | 900 | 1 | 600 |
| 23 | $1\times10^{20}$ | $5\times10^{18}$ | 0.2 | $5\times10^{16}$ | $1\times10^{18}$ | 0 | $5\times10^{17}$ | 1000 | $1\times10^{9}$ | 45 | Non | 0.6 | 900 | 1 | 1000 |
| 24 | $5\times10^{19}$ | $5\times10^{18}$ | 0.2 | $1\times10^{18}$ | $1\times10^{18}$ | 0 | $5\times10^{17}$ | 500 | $1\times10^{9}$ | 30 | Non | 0.85 | 850 | 1 | 1200 |
| 25 | $1\times10^{20}$ | $1\times10^{16}$ | 0.2 | $1\times10^{19}$ | $1\times10^{16}$ | 0 | $5\times10^{17}$ | 500 | $1\times10^{9}$ | 30 | Non | 1 | 900 | 1 | 1200 |
| 26 | $5\times10^{19}$ | $1\times10^{16}$ | 0.6 | $5\times10^{19}$ | $5\times10^{17}$ | 0 | $1\times10^{18}$ | 1000 | $1\times10^{9}$ | 60 | Observed | 0.6 | 650 | 1.05 | 600 |
| 27 | $5\times10^{21}$ | $5\times10^{19}$ | 0.6 | $1\times10^{18}$ | $5\times10^{19}$ | 0 | $1\times10^{18}$ | 1000 | $1\times10^{10}$ | 60 | Observed | 0.6 | 850 | 1.2 | 600 |

FIG. 7

[Table 5]

| Sample No. | $Al_xGa_{1-x}N$ Carbon concentration (atoms/cm³) | $Al_yGa_{1-y}N$ Carbon concentration (atoms/cm³) | Dislocation density (cm⁻²) | Warp (μm) | Crack | Pinch off Voltage (V) | Breakdown voltage (V) | Leak current | Electron mobility (cm²/Vs) |
|---|---|---|---|---|---|---|---|---|---|
| 28 | $1×10^{20}$<br>$9×10^{19}$<br>$6×10^{19}$ | $5×10^{19}$<br>$4×10^{19}$<br>$2×10^{19}$ | $1×10^9$ | 30 | Non | 1.5 | 900 | 1 | 1200 |
| 29 | $1×10^{20}$<br>$2×10^{19}$ | $5×10^{19}$<br>$1×10^{19}$ | $1×10^9$ | 30 | Non | 1.25 | 850 | 1 | 1200 |
| 30 | $1×10^{20}$<br>$1×10^{18}$ | $5×10^{19}$<br>$5×10^{17}$ | $1×10^9$ | 45 | Non | 1.15 | 750 | 1 | 1200 |
| 31 | $1×10^{20}$<br>$7×10^{17}$ | $5×10^{19}$<br>$7×10^{16}$ | $1×10^9$ | 90 | Observed | 0.7 | 650 | 1 | 1200 |
| 32 | $1×10^{20}$<br>$3×10^{20}$ | $5×10^{19}$<br>$2×10^{20}$ | $2×10^9$ | 90 | Observed | 0.7 | 800 | 1 | 1200 |

COMPOUND SEMICONDUCTOR SUBSTRATE COMPRISING A MULTILAYER BUFFER LAYER

BACKGROUND OF THE INVENTION

1. Field of the Invention

The present invention relates to a compound semiconductor substrate used preferably for a high speed or high breakdown voltage semiconductor device etc.

2. Description of the Related Art

A semiconductor device using a nitride semiconductor represented by gallium nitride in hexagonal crystal form (GaN), aluminum nitride in hexagonal crystal form (AlN), etc., allows a high breakdown voltage and a high frequency, surpasses properties of a silicon (Si) semiconductor device which is currently dominant, and is expected to be used for power devices etc.

As a method of fabricating the semiconductor device of this type and the compound semiconductor substrate used for its fabrication at low cost, it is known that a buffer area constituted by a plurality of AlGaN-based nitride semiconductor layers whose compositions are different is formed on a silicon (Si) or silicon carbide (SiC) single crystal substrate, and a nitride semiconductor active layer is formed on the layers of the buffer area.

For example, Japanese Patent Application Publication No. 2007-67077 (patent document 1) discloses that a plurality of first buffer layers composed of $Al_xGa_{1-x}N$ ($0.5 \leq x \leq 1$) and a plurality of second buffer layers composed of $Al_yGa_{1-y}N$ ($0.01 \leq y \leq 0.2$) are alternately stacked.

Further, Japanese Patent Application Publication No. 2008-171843 (patent document 2) discloses that a buffer layer is formed having a composite layer where a second layer formed using a nitride-based compound semiconductor in which an Al content is 0.8 or more is stacked on a first layer formed using a nitride-based compound semiconductor in which an Al content is 0.2 or less.

According to the buffer layer with the structure as disclosed in patent document 1 above, it is effective to form a nitride semiconductor which is flat and smooth without a crack. However, its breakdown voltage per unit film thickness is low and the compound semiconductor substrate suitable for a high breakdown voltage device may not be obtained. Further, it is not suitable for achieving a normally-off state.

On the other hand, patent document 2 discloses that it is possible to attain a high breakdown voltage by setting a carbon concentration of the first layer of the above-mentioned buffer layer as $1 \times 10^{17}$ atoms/cm$^3$ to $1 \times 10^{20}$ atoms/cm$^3$. However, even if the device is provided with the buffer layer having such a structure, it does not fully meet the recent demands for the high breakdown voltage and achieving the normally-off state.

SUMMARY OF THE INVENTION

The present invention is made to solve the above-mentioned technical problems, and aims to provide at low cost a compound semiconductor substrate which inhibits the generation of a crack or a warp and is suitable for a normally-off type high breakdown voltage device.

The compound semiconductor substrate in accordance with the present invention is arranged such that a multilayer buffer layer in which $Al_xGa_{1-x}N$ single crystal layers ($0.6 \leq X \leq 1.0$) containing carbon from $1 \times 10^{18}$ atoms/cm$^3$ to $1 \times 10^{21}$ atoms/cm$^3$ and $Al_yGa_{1-y}N$ single crystal layers ($0 \leq y \leq 0.5$) containing carbon from $1 \times 10^{17}$ atoms/cm$^3$ to $1 \times 10^{21}$ atoms/cm$^3$ are alternately and repeatedly stacked in order, and a nitride active layer comprising an electron transport layer having a carbon concentration of $5 \times 10^{17}$ atoms/cm$^3$ or less and an electron supply layer are deposited on a Si single crystal substrate in order, and characterized in that the carbon concentrations of the above-mentioned $Al_xGa_{1-x}N$ single crystal layers and the carbon concentration of the $Al_yGa_{1-y}N$ single crystal layers respectively decrease from the above-mentioned substrate side towards the above-mentioned active layer side.

By providing such a multilayer buffer layer, it is possible to inhibit the generation of the crack in the nitride active layer and the warp of the substrate and attain the normally-off state and the high breakdown voltage of the device using the substrate.

In the above-mentioned compound semiconductor substrate, it is preferable that the above-mentioned $Al_yGa_{1-y}N$ single crystal layer is of $0.1 \leq y \leq 0.5$ in terms of allowing the high breakdown voltage and the normally-off state.

Further, it is preferable that the carbon concentration of the above-mentioned $Al_xGa_{1-x}N$ single crystal layer is higher than the carbon concentration of the $Al_yGa_{1-y}N$ single crystal layer immediately above the former.

A lattice constant difference between the $Al_xGa_{1-x}N$ single crystal layer having a high carbon concentration and the crystal of the $Al_yGa_{1-y}N$ single crystal layer immediately above the former becomes large, which may produce strong compressive stress.

Further, it is preferable that the above-mentioned multilayer buffer layer contains boron from $5 \times 10^{16}$ atoms/cm$^3$ to $1 \times 10^{19}$ atoms/cm$^3$.

Containing boron at the above-mentioned concentration range, the carbon concentrations of the above-mentioned $Al_xGa_{1-x}N$ single crystal layer and the above-mentioned $Al_yGa_{1-y}N$ single crystal layer increase, thus achieving the improvement in breakdown voltage.

Furthermore, it is preferable that the above-mentioned electron transport layer is an $Al_zGa_{1-z}N$ single crystal layer ($0 \leq z \leq 0.01$).

In terms of improving the high speed of the device, it is preferable that an Al concentration in the above-mentioned electron transport layer is as low as possible.

Further, it is preferable that the above-mentioned electron transport layer of the above-mentioned compound semiconductor substrate has a thickness of from 1 nm to 500 nm and it can be used preferably for a normally-off type switching device.

According to the present invention, it is possible to provide at low cost the compound semiconductor substrate which inhibits the crack of the nitride active layer from generating and avoids the warp caused by thick film formation of the nitride semiconductor.

Furthermore, the compound semiconductor substrate in accordance with the present invention can suitably be applied to the high breakdown voltage device, especially the normally-off type switching device, since it is possible to improve the breakdown voltage by producing the device using the substrate.

BRIEF DESCRIPTION OF THE DRAWING

FIG. 2 is a table showing evaluation results of Samples 1-8.

FIG. 3 is a table showing evaluation results of Samples 9-16.

FIG. 4 is a table showing evaluation results of Samples 17-20.

FIG. 5 is a table showing evaluation results of Samples 21-27.

FIG. 7 is a table showing evaluation results of Samples 28-32.

DESCRIPTION OF THE PREFERRED EMBODIMENTS

Hereinafter, the present invention will be described in detail with reference to the drawings.

Figure 1:
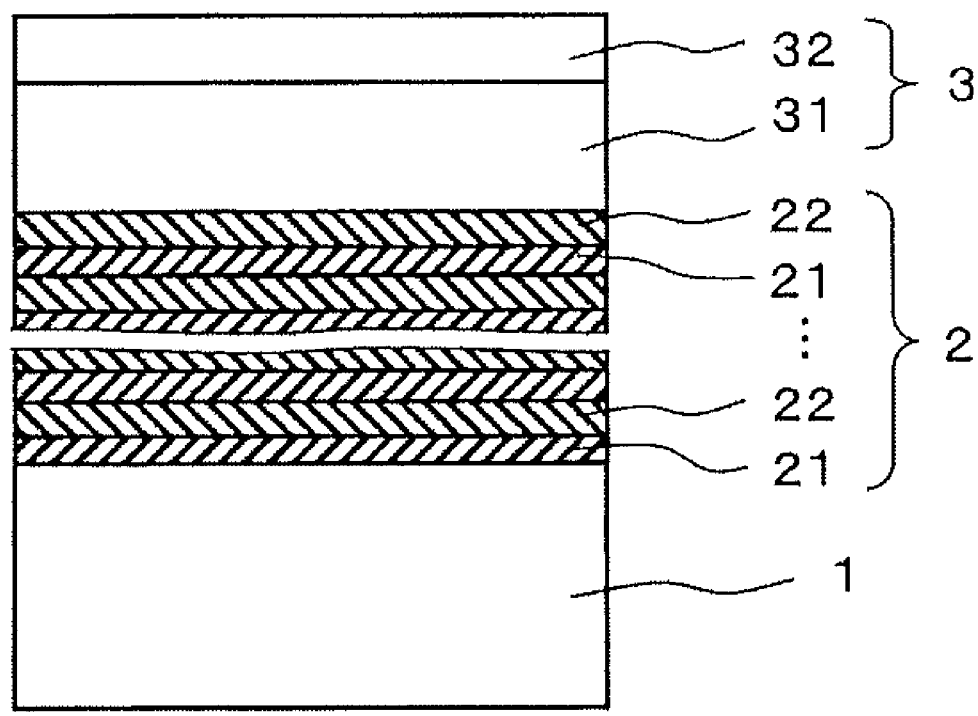
FIG. 1 is a schematic sectional view illustrating a layer structure of a compound semiconductor substrate in accordance with the present invention.

FIG. 1 schematically illustrates a layer structure of a compound semiconductor substrate in accordance with the present invention.

The compound semiconductor substrate illustrated in FIG. 1 has the structure in which a multilayer buffer layer 2 and a nitride active layer 3 which is constituted by an electron transport layer 31 and an electron supply layer 32 are stacked on a Si single crystal substrate 1 in order.

The above-mentioned multilayer buffer layer 2 is of a multilayer structure where $Al_xGa_{1-x}N$ single crystal layers ($0.6 \leq x \leq 1.0$) 21 and $Al_yGa_{1-y}N$ single crystal layers ($0 \leq y \leq 0.5$) 22 are alternately and repeatedly stacked in this order, from the Si substrate 1 side.

Further, the above-mentioned $Al_xGa_{1-x}N$ single crystal layer ($0.6 \leq x \leq 1.0$) 21 contains carbon from $1 \times 10^{18}$ atoms/$cm^3$ to $1 \times 10^{21}$ atoms/$cm^3$, and the above-mentioned $Al_yGa_{1-y}N$ single crystal layer ($0 \leq y \leq 0.5$) 22 contains carbon from $1 \times 10^{17}$ atoms/$cm^3$ to $1 \times 10^{21}$ atoms/$cm^3$.

By providing such a multilayer buffer layer 2, it is possible to inhibit a crack from generating in the nitride active layer 3 and the whole substrate from warping. In addition, an effect that a device using this substrate can be produced to withstand a high voltage is obtained.

In the case where a multilayer buffer layer is formed in such a way that a plurality of conventional AlGaN-based single crystals with different compositions are alternately stacked, carriers generated due to properties different between a Si single crystal substrate and each semiconductor film remain in the multilayer buffer layer, thereby inhibiting the device from withstanding a high-voltage.

In order to control such a carrier, it is advantageous that the multilayer buffer layer contains carbon therein.

In the present invention, the breakdown voltage of the device can be raised by intentionally adding carbon so as to provide the concentration range as mentioned above.

In the above-mentioned $Al_xGa_{1-x}N$ single crystal layer 21, the Al content x is set as $0.6 \leq x \leq 1.0$. Further, in the above-mentioned $Al_yGa_{1-y}N$ single crystal layer 22, the Al content y is set as $0 \leq y \leq 0.5$, preferably $0.1 \leq y \leq 0.5$.

In the case where $x<0.6$ and $y>0.5$, compressive stress unlikely to occur since a difference between a crystal-lattice constant of the $Al_xGa_{1-x}N$ single crystal layer and that of the $Al_yGa_{1-y}N$ single crystal layer is small.

On the other hand, in the case where $y<0.1$, the Al content of the $Al_yGa_{1-y}N$ layer is too low. Therefore, only a low breakdown voltage device as conventional or a conventional normally-on type device is obtained.

As described above, in the compound semiconductor substrate in accordance with the present invention, although the multilayer buffer layer 2 is caused to contain carbon at a predetermined concentration, it is preferable that carbon concentrations incline so that both the carbon concentration of the above-mentioned $Al_xGa_{1-x}N$ single crystal layer 21 and the carbon concentration of the $Al_yGa_{1-y}N$ single crystal layer 22 respectively decrease from the above-mentioned substrate 1 side towards the above-mentioned active-layer 3 side.

Since the carbon concentration is higher on the substrate 1 side, residual carriers decrease, thus increasing the breakdown voltage. Physically, Fermi level is away from a conduction band.

Further, when causing the closest side of active-layer 3 to be at a low carbon concentration, in the case where a gate voltage is not applied, the carrier is not excited.

Physically, the Fermi level approaches the conduction band, and a positive voltage (several V) at a gate allows on/off control in the device, i.e. leading to a normally-off state.

Thus, in addition to the increased breakdown voltage, the normally-off state is attained by the above-mentioned inclination of the carbon concentrations in the $Al_xGa_{1-x}N$ single crystal layer 21 and the $Al_yGa_{1-y}N$ single crystal layer 22.

Therefore, in the arrangement where the carbon concentration simply decreases at a predetermined rate as a whole from the substrate 1 side towards the active-layer 3 side, the normally-off state is not attained. The above-mentioned carbon concentration change and the layer structure in accordance with the present invention are important to realize a good normally-off type and high breakdown voltage device.

Further, let the above-mentioned $Al_xGa_{1-x}N$ single crystal layer 21 and the $Al_yGa_{1-y}N$ single crystal layer 22 immediately above the former be one pair, it is preferable that the $Al_xGa_{1-x}N$ single crystal layer 21 (lower layer) has a higher carbon concentration than that of the $Al_yGa_{1-y}N$ single crystal layer 22 (upper layer).

Since the $Al_xGa_{1-x}N$ single crystal layer 21 with the higher carbon concentration is of a soft crystal, it is likely to generate dislocation and relax the crystal. Since the relaxed crystal has a large lattice constant difference from that of the crystal of the $Al_yGa_{1-y}N$ single crystal layer 22 immediately above the former, strong compressive stress takes place.

Further, it is preferable that the above-mentioned multilayer buffer layer 2 contains boron from $5 \times 10^{16}$ atoms/$cm^3$ to $1 \times 10^{19}$ atoms/$cm^3$.

Containing boron at the above-mentioned concentration range, the carbon concentrations of the $Al_xGa_{1-x}N$ single crystal layer 21 and the $Al_yGa_{1-y}N$ single crystal layer 22 can be increased further, thus achieving the improvement in breakdown voltage.

It is assumed that, in crystal lattices of the $Al_xGa_{1-x}N$ single crystal layer 21 and the $Al_yGa_{1-y}N$ single crystal layer 22, boron enters lattice positions of Ga, so that the lattice constants increase and more carbons are taken into the interstitial site.

In the case where the above-mentioned boron concentration is less than $5 \times 10^{16}$ atoms/$cm^3$, the carbon concentration of the multilayer buffer layer decreases, and the breakdown voltage of the device becomes as low as the conventional one.

On the other hand, in the case where the above-mentioned boron concentration exceeds $1 \times 10^{19}$ atoms/$cm^3$, the carbon concentration exceeds the maximum value as specified above, and crystallinity is worsened.

Further, in the above-mentioned multilayer buffer layer 2, it is preferable that the $Al_xGa_{1-x}N$ single crystal layer 21 has a thickness of from 1 nm to 50 nm and the $Al_yGa_{1-y}N$ single crystal layer 22 has a thickness of from 10 nm to 500 nm.

The two types of AlGaN-based single crystal layers which constitute the multilayer buffer layer 2 are formed to have different film thicknesses as described above, so that controllability of the stress generated between the substrate and the multilayer buffer layer made of the nitride semiconductor can be improved. For example, warp can be reduced to 30 μm or less in the substrate having a diameter of 4 inches.

In the case where the thickness of the above-mentioned $Al_xGa_{1-x}N$ single crystal layer 21 is less than 1 nm or in the case where the thickness of the $Al_yGa_{1-y}N$ single crystal layer 22 is less than 10 nm, crystallinity required for the buffer is not obtained.

On the other hand, in the case where the thickness of the above-mentioned $Al_xGa_{1-x}N$ single crystal layer 21 exceeds 50 nm or in the case where the thickness of the $Al_yGa_{1-y}N$ single crystal layer 22 exceeds 500 nm, manufacture costs increase and a reasonable efficiency may not be obtained.

Further, in the case where the $Al_xGa_{1-x}N$ single crystal layer 21 and the $Al_yGa_{1-y}N$ single crystal layer 22 immediately above the former are set as one pair, it is preferable that 5-100 pairs thereof are repeatedly stacked for the above-mentioned multilayer buffer layer 2.

Too small a number of the stacked pairs result in insufficient stress relaxation by the multilayer buffer layer, the effect of inhibiting the crack or warp is not fully obtained.

On the other hand, in the case where there are too many stacked pairs, it becomes costly and is inferior in respect of manufacturing efficiency, which is not preferred.

Further, it is preferable that the carbon concentration of the electron transport layer 31 formed on the above-mentioned multilayer buffer layer 2 is $5 \times 10^{17}$ atoms/cm$^3$ or less.

The presence of carbon in the electron transport layer 31 scatters electrons and the mobility is reduced, so that the rapidity of the device decreases. Thus, it is preferable that the carbon concentration is lower. When the above-mentioned carbon concentration is $5 \times 10^{17}$ atoms/cm$^3$ or less, a difference in rapidity of the device is small.

In addition, according to the measurement by a secondary ion mass spectrometry (SIMS) process, the minimum limit of detection of the carbon concentration is $5 \times 10^{16}$ atoms/cm$^3$ in the current technical level. In the case of exceeding $5 \times 10^{17}$ atoms/cm$^3$, it was confirmed that the rapidity of the device decreased significantly.

It is preferable that the above-mentioned electron transport layer 31 is an $Al_zGa_{1-z}N$ single crystal layer ($0 \leq z \leq 0.01$).

The presence of aluminum (Al) in the electron transport layer 31 scatters electrons and the mobility is reduced, so that the rapidity of the device also decreases in this case. Therefore, the lower the Al concentration, the more preferable. However, it is practically difficult to let z=0 in terms of contamination of the residual Al in a furnace when forming the electron transport layer 31. Thus, it is preferable that $z \leq 0.01$ as a concentration at which Al is contained intentionally.

More preferably, z=0 i.e., the above-mentioned electron transport layer 31 is a GaN layer. Thus, the electron transport layer 31 is of the GaN layer and differentiated from the above-mentioned multilayer buffer layer 2 in terms of the Al concentration. This means physically that Fermi level is away from the conduction band, which is preferred also in terms of the normally-off state.

Further, it is preferable that the above-mentioned electron transport layer 31 is formed to have a thickness of approximately 1-5000 nm in order to avoid the generation of a crack.

The above-described compound semiconductor substrate in accordance with the present invention can be used preferably for a normally-off type switching device by forming the above-mentioned electron transport layer 31 to have a thickness of from 1 nm to 500 nm.

By "normally-off type device" we mean one which is in a stop (OFF) state in the case where a voltage is not applied to a control electrode referred to as a gate electrode (zero voltage) and which is in an operation (ON) state when a positive voltage is applied.

On the other hand, by "normally-on type device" we mean one which is in the operation (ON) state without applying a voltage to the gate electrode (control electrode) (zero voltage) and which is in the stop (OFF) state when a negative voltage is applied.

In terms of safety of a circuit etc., the switching device of the normally-off type is preferred to that of the normally-on type and the compound semiconductor substrate in accordance with the present invention is very useful for forming the device.

The process of manufacturing the above-mentioned Si single crystal substrate 1 is not particularly limited. It may be manufactured by the Czochralski (CZ) process, or may be manufactured by a floating zone (FZ) process. Further, it may be manufactured in such a way that a Si single crystal layer is epitaxially grown on the Si single crystal substrate by a vapor deposition process (Si epitaxial substrate).

By epitaxially growing the nitride semiconductor on the Si single crystal substrate, it is possible to utilize the apparatuses and techniques which are used in the conventional Si semiconductor manufacturing process, whereby a large diameter substrate can be manufactured at low cost.

In addition, before forming the multilayer buffer layer 2 on the above-mentioned Si single crystal substrate 1, it is possible to form an AlN single crystal layer etc. as an initial buffer in order to improve affinity of Si single crystal substrate 1 to the $Al_xGa_{1-x}N$ single crystal layer 21.

Since Ga very highly reacts with Si, in the case where Ga adheres to a Si substrate surface in initial stages of growth, roughness of the Si single crystal substrate surface arises as a result of a melt back etching reason.

For this reason, the above-mentioned initial buffer is effective as protection and a primer of the Si single crystal substrate surface before forming a multilayer buffer layer.

Further, another layer, such as a modulation doped layer, a spacer layer, etc., may be formed between the above-mentioned electron transport layer 31 and the electron supply layer 32. Furthermore, according to an object and use when fabricating the device, it is possible to form another layer, such as a cap layer, a passivation layer, etc., on the nitride active layer 3.

In addition, usually, each of the compound semiconductor layers in accordance with the present invention is deposited and formed by epitaxial growth, but not particularly limited thereto and a process generally used may be employed. For example, it is possible to use CVD processes including MOCVD (Metal Organic Chemical Vapor Deposition) and PECVD (Plasma Enhanced Chemical Vapor Deposition), a depositing process using a laser beam, a sputtering process using atmosphere gas, MBE (Molecular Beam Epitaxy) using a molecular beam under high vacuum, MOMBE (Metal Organic Molecular Beam Epitaxy) which is a combination of MOCVD and MBE, etc.

Further, materials used when epitaxially growing each layer are not limited to those used in the following Example. Source gases with which carbon is included may be, for example, acetylene, ethane, propane, trimethyl aluminum, and trimethyl gallium, other than methane.

Furthermore, forming or processing the electrodes when fabricating the compound semiconductor device by means of the above-described compound semiconductor substrate in accordance with the present invention is not particularly limited, and can be carried out by a general method. For example, it is possible to form an electrode at a surface and the back of the above-mentioned substrate with a known material by vacuum deposition or lithography.

EXAMPLE

Hereinafter, the present invention will be described more particularly with reference to Example, but the present invention is not limited to the following Example.

Samples of a compound semiconductor substrate were produced under the following conditions. Each substrate and a device produced using the substrate were evaluated as follows:
(Evaluation of Substrate)

As for each compound semiconductor substrate sample, a dislocation density in an $Al_zGa_{1-z}N$ single crystal layer used as an electron transport layer 31 was evaluated by a transmission electron microscope. Further, the generation of warp and a crack was also evaluated with a laser displacement meter and an optical microscope.
(Evaluation of Device)

For each compound semiconductor substrate sample, a recess between a recess gate region and an element isolating region was formed by dry etching. A gold (Au) electrode as a gate electrode and aluminum (Al) electrodes as source and drain electrodes were formed on an active-layer side, and an Al electrode as a back electrode was formed on the back side of a Si substrate, each being carried out by vacuum deposition to make a compound semiconductor device.

As for the thus obtained compound semiconductor device, while applying a voltage across source and drain electrodes by means of a curve tracer, current-voltage properties at the time of applying a voltage to the gate electrode were measured to find a pinch off voltage, and a degree of the normally-off state was evaluated.

Then, while applying a pinch off voltage to the gate electrode, current-voltage properties at the time of applying a voltage across the source and drain electrodes were measured, to find breakdown voltage properties.

In addition, the source electrode and the back electrode were electrically short-circuited at the time of measuring the device.

Further, an Al electrode as ohmic contact was formed on each compound semiconductor substrate sample by vacuum deposition and Hall effect measurement was carried out, to thereby find electron mobility in the electron transport layer and evaluate the rapidity of the device.

Hereinafter, a production process for each compound semiconductor substrate sample and conditions are shown.
[Sample 1] (Standard Sample)

A compound semiconductor substrate provided with layer structure as shown in FIG. 1 was produced according to the following processes.

Firstly, a Si single crystal substrate 1 having a diameter of 4 inches was placed in a MOCVD equipment. Trimethyl aluminum (TMA) gas, $NH_3$ gas, methane gas, and diborane gas were used as source gases, and an AlN single crystal layer ($Al_xGa_{1-x}N$ single crystal layer (x=1)) 21 having a thickness of 20 nm and containing carbon at $1\times10^{20}$ atoms/$cm^3$ was formed by vapor phase epitaxy at 1000° C. Further, trimethyl gallium (TMG) gas, TMA gas, $NH_3$ gas, methane gas, diborane gas were used as source gases, and a GaN single crystal layer ($Al_yGa_{1-y}N$ single crystal layer (y=0.2)) 22 having a thickness of 80 nm and containing carbon at $5\times10^{19}$ atoms/$cm^3$ was stacked on the AlN single crystal layer by vapor phase epitaxy at 1000° C. Similarly, these steps were alternately repeated so that carbon concentrations might decrease from the above-mentioned substrate side towards the above-mentioned active-layer side, respectively. Ten layers for each (20 layers in total) were stacked to form a multilayer buffer layer 2.

TMG gas, TMA gas, $NH_3$ gas, and methane gas were used as source gases, and an $Al_{0.02}Ga_{0.98}N$ single crystal layer ($Al_zGa_{1-z}N$ layer (z=0.02)) having a thickness of 1000 nm and containing carbon at $5\times10^{17}$ atoms/$cm^3$ as the electron transport layer 31 was stacked on the above-mentioned multilayer buffer layer 2 by vapor phase epitaxy at 1000° C. Further, the electron supply layer 32 of an $Al_{0.25}Ga_{0.75}N$ single crystal having a thickness of 30 nm was stacked, a nitride active layer 3 was formed, and the compound semiconductor substrate was obtained.

In addition, adjustment of the thickness of each layer formed by the vapor phase epitaxy was carried out by adjustment of a gas flow rate and a supply period.
[Samples 2-4] (Compositions of $Al_xGa_{1-x}N$ Single Crystal Layers 21)

In Sample 1, an $Al_zGa_{1-z}N$ layer which was the electron transport layer 31 was formed into a GaN layer (z=0) having a thickness of 500 nm, and an $Al_yGa_{1-y}N$ single crystal layer 22 was formed into an $Al_{0.2}Ga_{0.8}N$ single crystal layer (y=0.2). The value x of the $Al_xGa_{1-x}N$ single crystal layer 21 was varied to $Al_{0.5}Ga_{0.5}N$ (x=0.5) (Sample 2), $Al_{0.6}Ga_{0.4}N$ (x=0.6) (Sample 3), and AlN (x=1) (Sample 4). The other processes were similar to those for Sample 1, to produce the compound semiconductor substrates.
[Samples 5-8] (Compositions of $Al_yGa_{1-y}N$ Single Crystal Layers 22)

In Sample 4, the value y of the $Al_yGa_{1-y}N$ single crystal layer 22 was varied to GaN (y=0) (Sample 5), $Al_{0.1}Ga_{0.9}N$ (y=0.1) (Sample 6), $Al_{0.5}Ga_{0.5}N$ (y=0.5) (Sample 7), and $Al_{0.6}Ga_{0.4}N$ (y=0.6) (Sample 8). The other processes were similar to those for Sample 1, to produce the compound semiconductor substrates.

Evaluation results of Samples 1-8 are collectively shown in Table 1 (FIG. 2).

In addition, Sample 1 is considered as the standard sample when comparing other Samples with it. Leak current is expressed with a relative index when assuming Sample 1 as 1 in Table 1. The same applies to the following evaluation results.

As can be seen from the evaluation results shown in Table 1, in the case where x<0.6 (Sample 2) and y>0.5 (Sample 8), the warp of the substrate was large, the generation of a crack was also observed, and the leak current of the device was larger.

It was confirmed that Samples except Samples 2 and 8 had good normally-off properties and improved the rapidity of the devices.
[Samples 9-11] (carbon concentrations of $Al_xGa_{1-x}N$ single crystal layers 21)

In Sample 4, the carbon concentration of the $Al_xGa_{1-x}N$ single crystal layer 21 was varied as shown in Samples 9-11 of the following Table 2. The other processes were similar to those for Sample 1, to produce the compound semiconductor substrates.
[Samples 12-15] (Carbon Concentrations of $Al_yGa_{1-y}N$ Single Crystal Layers 22)

In Sample 4, the carbon concentration of the $Al_yGa_{1-y}N$ single crystal layer 22 was varied as shown in Samples 12-15 of the following Table 2. The other processes were similar to those for Sample 1, to produce the compound semiconductor substrates.

[Sample 16] (Inclination of Carbon Concentration)

After stacking the AlN single crystal layer 21 and the $Al_{0.2}Ga_{0.8}N$ single crystal layer 22 on the Si single crystal substrate 1, the respective carbon concentrations were alternately and repeatedly increased, from the above-mentioned substrate side towards the above-mentioned active layer side, at a predetermined rate to $3\times10^{20}$ atoms/cm$^3$ of the 10th AlN single crystal layer 21 and to $2\times10^{20}$ atoms/cm$^3$ of the 10th $AlN_{0.2}Ga_{0.8}N$ single crystal layer 22, and 10 layers for each (20 layers in total) were stacked to form the multilayer buffer layer 2. The other processes were similar to those for Sample 1, to produce the compound semiconductor substrates.

Evaluation results of Samples 9-16 are collectively shown in Table 2 (FIG. 3).

As can be seen from the evaluation results shown in Table 2, in the case where the carbon concentration of the $Al_xGa_{1-x}N$ single crystal layer 21 was less than $1\times10^{18}$ atoms/cm$^3$ (Sample 9) and the carbon concentration of the $Al_yGa_{1-y}N$ single crystal layer 22 was less than $1\times10^{17}$ atoms/cm$^3$ (Sample 12), the breakdown voltages were less than 650V, which was not preferred for the device.

Further, in the case where the carbon concentration of the $Al_xGa_{1-x}N$ single crystal layer 21 exceeded $1\times10^{21}$ atoms/cm$^3$ (Sample 11) and the carbon concentration of the $Al_yGa_{1-y}N$ single crystal layer 22 exceeded $1\times10^{21}$ atoms/cm$^3$ (Sample 15), dislocation densities of the substrates were equal to or greater than $1\times10^{10}$ cm$^{-2}$, which was of inferior crystallinity and not preferred for the device; the leak current of the device was also large.

Further, in the case where the $Al_xGa_{1-x}N$ single crystal layers 21 and the $Al_yGa_{1-y}N$ single crystal layers 22 were stacked so that the carbon concentrations were inclined so as to increase (Sample 16), the dislocation density of the substrate was high, the warp was also large, and the crack occurred.

It was confirmed that Samples 10 and 16 had good stress-controlling properties and good normally-off properties, and the rapidity of the devices was improved.

[Samples 17-20] (Boron Addition (1))

In Sample 4, boron was added into the $Al_xGa_{1-x}N$ single crystal layer 21 and the $Al_yGa_{1-y}N$ single crystal layer 22. On the basis of Sample 4, boron concentrations were varied as shown in Samples 17-20 of the following Table 3. The other processes were similar to those for Sample 1, to produce the compound semiconductor substrates.

Evaluation results of Samples 17-20 are collectively shown in Table 3 (FIG. 4).

As can be seen from the evaluation results shown in Table 3, in the case where the added boron concentrations of the $Al_xGa_{1-x}N$ single crystal layer 21 and the $Al_yGa_{1-y}N$ single crystal layer 22 were between $5\times10^{16}$ atoms/cm$^3$ and $1\times10^{19}$ atoms/cm$^3$ (Samples 17-19), it was confirmed that normally-off properties were good and the rapidity of the devices was improved.

[Samples 21-27] (Boron Addition (2))

In Sample 18, each parameter of the $Al_xGa_{1-x}N$ single crystal layer 21, the $Al_yGa_{1-y}N$ single crystal layer 22, and the $Al_zGa_{1-z}N$ layer which was the electron transport layer 31 was varied as shown in Samples 21-27 of the following Table 4. The other processes were similar to those for Sample 1, to produce the compound semiconductor substrates.

Evaluation results of Samples 21-27 are collectively shown in Table 4 (FIG. 5).

As can be seen from the evaluation results shown in Table 4, even in the case where boron was added into the $Al_xGa_{1-x}N$ single crystal layer 21 and the $Al_yGa_{1-y}N$ single crystal layer 22 and when each composition and the carbon concentration were within a range specified by the present invention, it was confirmed that the stress-controlling properties and the normally-off properties were good and the rapidity of the devices was improved.

[Sample 28] (Inclination of Carbon Concentration when Adding Boron)

In Sample 18, the AlN single crystal layers 21 and the $Al_{0.2}Ga_{0.8}N$ single crystal layers 22 were repeatedly stacked up to seven layers for each (14 layers in total) on the Si single crystal substrate 1. Then, the carbon concentration of the eighth AlN single crystal layer 21 was set as $9\times10^{19}$ atoms/cm$^3$ and the carbon concentration of the eighth $AlN_{0.2}Ga_{0.8}N$ single crystal layer 22 was set as $4\times10^{19}$ atoms/cm$^3$, so that the carbon concentrations might slightly decrease from the above-mentioned substrate side towards the above-mentioned active-layer side. The stacking was alternately repeated up to the ninth layer for each. Further, the carbon concentration of the layer the 10th AlN single crystal layer 21 was set as $6\times10^{19}$ atoms/cm$^3$ and the carbon concentration of the 10th $AlN_{0.2}Ga_{0.8}N$ single crystal layer 22 was set as $2\times10^{19}$ atoms/cm$^3$, varying a rate of decrease in carbon concentration. The respective layers were stacked up to 10 layers (20 layers in total) to form the multilayer buffer layer 2. The other processes were similar to those for Sample 1, to produce the compound semiconductor substrates.

[Samples 29-31] (Inclination of Carbon Concentration when Adding Boron)

In Sample 28, 10 layers for each (20 layers in total) were alternately and repeatedly stacked to form the multilayer buffer layer 2 in such a way that the carbon concentration of the 10th AlN single crystal layer 21 and the $AlN_{0.2}Ga_{0.8}N$ single crystal layers 22 had the values as shown in Samples 29-31 of the following Table 5 and both were decreased at a predetermined rate from the above-mentioned substrate side towards the above-mentioned active-layer side. The other processes were similar to those for Sample 1, to produce the compound semiconductor substrates.

[Sample 32] (Inclination of Carbon Concentration when Adding Boron)

In Sample 28, 10 layers for each (20 layers in total) were alternately and repeatedly stacked to form the multilayer buffer layer 2 in such a way that the carbon concentration of the 10th AlN single crystal layer 21 was $3\times10^{20}$ atoms/cm$^3$, the carbon concentration of the 10th $AlN_{0.2}Ga_{0.8}N$ single crystal layer 22 was $2\times10^{20}$ atoms/cm$^3$, and both were increased from the above-mentioned substrate side towards the above-mentioned active-layer side. The other processes were similar to those for Sample 1, to produce the compound semiconductor substrates.

Figure 6:
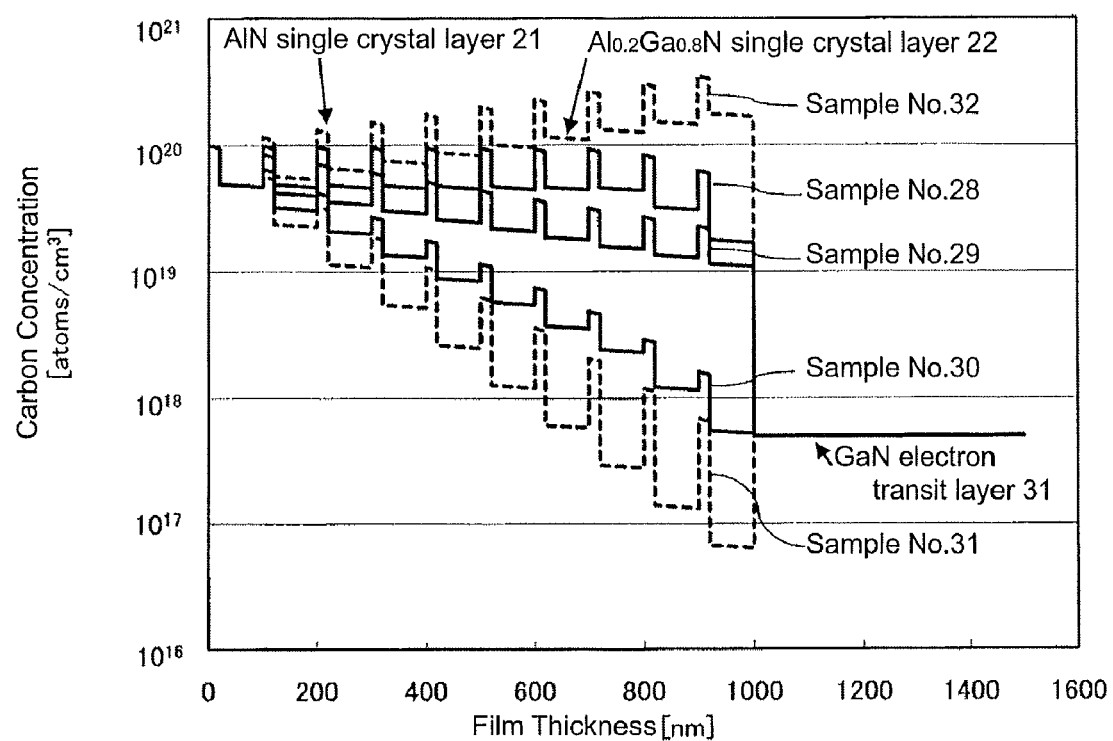
FIG. 6 is a graph showing a profile for carbon concentrations against film thicknesses, from a Si single crystal substrate surface, of a multilayer buffer layer and a nitride active layer of the compound semiconductor substrate according to Samples 28-32.

FIG. 6 shows in graph a profile for the carbon concentrations against film thicknesses, from the Si single crystal substrate surface, of the multi layer buffer layers and nitride active layers of the compound semiconductor substrates according to samples 28-32.

Further, the evaluation results of Samples 28-32 are collectively shown in Table 5 (FIG. 7).

As can be seen from the evaluation results shown in Table 5, even in the case where boron was added into the $Al_xGa_{1-x}N$ single crystal layer 21 and the $Al_yGa_{1-y}N$ single crystal layer 22, when the multilayer buffer layers were formed so that each carbon concentration might decrease within a predetermined range (Samples 28-30), it was confirmed that the stress-controlling properties and the normally-off properties were good and the rapidity of the devices was improved.

What is claimed is:

1. A compound semiconductor substrate, arranged such that a multilayer buffer layer in which $Al_xGa_{1-x}N$ single crystal layers ($0.6 \leq X \leq 1.0$) containing carbon from $1\times10^{18}$ atoms/cm³ to $1\times10^{21}$ atoms/cm³ and $Al_yGa_{1-y}N$ single crystal layers ($0 \leq y \leq 0.5$) containing carbon from $1\times10^{17}$ atoms/cm³ to $1\times10^{21}$ atoms/cm³ are alternately and repeatedly stacked, and a nitride active layer comprising an electron transport layer having a carbon concentration of $5\times10^{17}$ atoms/cm³ or less and an electron supply layer are deposited successively on a Si single crystal substrate, wherein a carbon concentration of said $Al_xGa_{1-x}N$ single crystal layers and a carbon concentration of said $Al_yGa_{1-y}N$ single crystal layers respectively decreases from said Si single crystal substrate side towards said active layer side.

2. The compound semiconductor substrate as claimed in claim 1, wherein said $Al_yGa_{1-y}N$ single crystal layers are of $0.1 \leq y \leq 0.5$.

3. The compound semiconductor substrate as claimed in claim 1, wherein the carbon concentration of one of said $Al_xGa_{1-x}N$ single crystal layers is higher than the carbon concentration of one of said $Al_yGa_{1-y}N$ single crystal layers immediately above the former.

4. The compound semiconductor substrate as claimed in claim 2, wherein the carbon concentration of one of said $Al_xGa_{1-x}N$ single crystal layers is higher than the carbon concentration of one of said $Al_yGa_{1-y}N$ single crystal layers immediately above the former.

5. The compound semiconductor substrate as claimed in claim 1, wherein said multilayer buffer layer contains boron from $5\times10^{16}$ atoms/cm³ to $1\times10^{19}$ atoms/cm³.

6. The compound semiconductor substrate as claimed in claim 2, wherein said multilayer buffer layer contains boron from $5\times10^{16}$ atoms/cm³ to $1\times10^{19}$ atoms/cm³.

7. The compound semiconductor substrate as claimed in claim 3, wherein said multilayer buffer layer contains boron from $5\times10^{16}$ atoms/cm³ to $1\times10^{19}$ atoms/cm³.

8. The compound semiconductor substrate as claimed in claim 4, wherein said multilayer buffer layer contains boron from $5\times10^{16}$ atoms/cm³ to $1\times10^{19}$ atoms/cm³.

9. The compound semiconductor substrate as claimed in claim 1, wherein said electron transport layer is an $Al_zGa_{1-z}N$ single crystal layer ($0 \leq z \leq 0.01$).

10. The compound semiconductor substrate as claimed in claim 2, wherein said electron transport layer is an $Al_zGa_{1-z}N$ single crystal layer ($0 \leq z \leq 0.01$).

11. The compound semiconductor substrate as claimed in claim 3, wherein said electron transport layer is an $Al_zGa_{1-z}N$ single crystal layer ($0 \leq z \leq 0.01$).

12. The compound semiconductor substrate as claimed in claim 4, wherein said electron transport layer is an $Al_zGa_{1-z}N$ single crystal layer ($0 \leq z \leq 0.01$).

13. The compound semiconductor substrate as claimed in claim 5, wherein said electron transport layer is an $Al_zGa_{1-z}N$ single crystal layer ($0 \leq z \leq 0.01$).

14. The compound semiconductor substrate as claimed in claim 6, wherein said electron transport layer is an $Al_zGa_{1-z}N$ single crystal layer ($0 \leq z \leq 0.01$).

15. The compound semiconductor substrate as claimed in claim 7, wherein said electron transport layer is an $Al_zGa_{1-z}N$ single crystal layer ($0 \leq z \leq 0.01$).

16. The compound semiconductor substrate as claimed in claim 8, wherein said electron transport layer is an $Al_zGa_{1-z}N$ single crystal layer ($0 \leq z \leq 0.01$).

17. The compound semiconductor substrate as claimed in claim 1, wherein said electron transport layer has a thickness of from 1 nm to 500 nm and said compound semiconductor substrate is used for a normally-off type switching device.

18. The compound semiconductor substrate as claimed in claim 2, wherein said electron transport layer has a thickness of from 1 nm to 500 nm and said compound semiconductor substrate is used for a normally-off type switching device.

19. The compound semiconductor substrate as claimed in claim 3, wherein said electron transport layer has a thickness of from 1 nm to 500 nm and said compound semiconductor substrate is used for a normally-off type switching device.

20. The compound semiconductor substrate as claimed in claim 4, wherein said electron transport layer has a thickness of from 1 nm to 500 nm and said compound semiconductor substrate is used for a normally-off type switching device.

21. The compound semiconductor substrate as claimed in claim 5, wherein said electron transport layer has a thickness of from 1 nm to 500 nm and said compound semiconductor substrate is used for a normally-off type switching device.

22. The compound semiconductor substrate as claimed in claim 6, wherein said electron transport layer has a thickness of from 1 nm to 500 nm and said compound semiconductor substrate is used for a normally-off type switching device.

23. The compound semiconductor substrate as claimed in claim 7, wherein said electron transport layer has a thickness of from 1 nm to 500 nm and said compound semiconductor substrate is used for a normally-off type switching device.

24. The compound semiconductor substrate as claimed in claim 8, wherein said electron transport layer has a thickness of from 1 nm to 500 nm and said compound semiconductor substrate is used for a normally-off type switching device.

25. The compound semiconductor substrate as claimed in claim 9, wherein said electron transport layer has a thickness of from 1 nm to 500 nm and said compound semiconductor substrate is used for a normally-off type switching device.

26. The compound semiconductor substrate as claimed in claim 10, wherein said electron transport layer has a thickness of from 1 nm to 500 nm and said compound semiconductor substrate is used for a normally-off type switching device.

27. The compound semiconductor substrate as claimed in claim 11, wherein said electron transport layer has a thickness of from 1 nm to 500 nm and said compound semiconductor substrate is used for a normally-off type switching device.

28. The compound semiconductor substrate as claimed in claim 12, wherein said electron transport layer has a thickness of from 1 nm to 500 nm and said compound semiconductor substrate is used for a normally-off type switching device.

29. The compound semiconductor substrate as claimed in claim 13, wherein said electron transport layer has a thickness of from 1 nm to 500 nm and said compound semiconductor substrate is used for a normally-off type switching device.

30. The compound semiconductor substrate as claimed in claim 14, wherein said electron transport layer has a thickness of from 1 nm to 500 nm and said compound semiconductor substrate is used for a normally-off type switching device.

31. The compound semiconductor substrate as claimed in claim 15, wherein said electron transport layer has a thickness of from 1 nm to 500 nm and said compound semiconductor substrate is used for a normally-off type switching device.

32. The compound semiconductor substrate as claimed in claim 16, wherein said electron transport layer has a thickness of from 1 nm to 500 nm and said compound semiconductor substrate is used for a normally-off type switching device.

\* \* \* \* \*